United States Patent
Yun et al.

(10) Patent No.: US 8,300,496 B2
(45) Date of Patent: Oct. 30, 2012

(54) SEMICONDUCTOR MEMORY APPARATUS AND TEST METHOD THEREOF

(75) Inventors: Tae Sik Yun, Ichon-shi (KR); Hyung Dong Lee, Ichon-shi (KR); Jun Gi Choi, Ichon-shi (KR); Sang Jin Byeon, Ichon-shi (KR); Sang Hoon Shin, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 136 days.

(21) Appl. No.: 12/948,874

(22) Filed: Nov. 18, 2010

(65) Prior Publication Data
US 2012/0057413 A1    Mar. 8, 2012

(30) Foreign Application Priority Data
Sep. 3, 2010    (KR) .................. 10-2010-0086491

(51) Int. Cl.
  G11C 8/18    (2006.01)
  G11C 8/16    (2006.01)
  G11C 7/00    (2006.01)
(52) U.S. Cl. ............... 365/233.12; 365/201; 365/233.13
(58) Field of Classification Search .............. 365/233.12
See application file for complete search history.

(56) References Cited

U.S. PATENT DOCUMENTS

| | | | |
|---|---|---|---|
| 5,933,379 A | 8/1999 | Park et al. | |
| 7,551,499 B2 | 6/2009 | Lee | |
| 7,734,967 B2 | 6/2010 | Chung et al. | |
| 7,800,422 B2 * | 9/2010 | Lee et al. | 327/158 |
| 8,149,036 B2 * | 4/2012 | Seo | 327/175 |
| 2001/0007136 A1 * | 7/2001 | Tamura et al. | 713/500 |
| 2006/0224847 A1 * | 10/2006 | Seto et al. | 711/167 |
| 2007/0226567 A1 | 9/2007 | Gorman et al. | |

FOREIGN PATENT DOCUMENTS

| | | |
|---|---|---|
| KR | 1020030014568 A | 2/2003 |
| KR | 10-2006-0038026 A | 5/2006 |
| KR | 10-2008-0029241 A | 4/2008 |

* cited by examiner

*Primary Examiner* — Son Mai
(74) *Attorney, Agent, or Firm* — William Park & Associates Ltd.

(57) ABSTRACT

A semiconductor memory apparatus includes a clock control unit configured to receive a first clock when an enable signal is activated and generate a second clock which has a cycle closer in length to a target clock cycle than the first clock; a DLL input clock generation unit configured to output one of the first clock and the second clock as a DLL input clock according to a DLL select signal; and an address/command input clock generation unit configured to output one of the first clock and the second clock as an AC input clock according to the enable signal.

41 Claims, 6 Drawing Sheets

SEMICONDUCTOR MEMORY APPARATUS AND TEST METHOD THEREOF

CROSS-REFERENCES TO RELATED APPLICATION

The present application claims priority under 35 U.S.C. §119(a) to Korean Application No. 10-2010-0086491, filed on Sep. 3, 2010, in the Korean Intellectual Property Office, which is incorporated herein by reference in its entirety as if set forth in full.

BACKGROUND

1. Technical Field

The present invention relates to a semiconductor memory apparatus, and more particularly, to a semiconductor memory apparatus which is tested in synchronization with an external clock.

2. Related Art

A semiconductor memory apparatus is often tested to check its normal operation. Since a semiconductor memory apparatus typically receives a clock signal and operates in synchronization with the clock signal, testing the semiconductor memory apparatus is done by inputting a clock signal from a test equipment to the semiconductor memory apparatus and then inputting and outputting test data to and from the semiconductor memory apparatus. Testing a semiconductor memory apparatus includes testing for checking normal operation of a cell, testing for checking coupling effect between adjacent metal lines, and testing for checking a margin between signals with temporal characterization.

Semiconductor memory apparatuses of these days operate at a high speed. Such high speed operation of semiconductor memory apparatuses may cause problems in testing such devices. Specifically, a semiconductor memory apparatus may be tested in a wafer level in which chips are arranged in a wafer state before being separated from one another or may be tested in a package level in which chips are separated and are coupled to a package state. In a wafer level test, a maximum frequency value of a clock signal inputted to a semiconductor memory chip by an outmoded test equipment often falls short of the value of a frequency (referred to as a 'target frequency') at which the semiconductor memory apparatus will operate in the packaged state, due to the high speed operation of the semiconductor memory apparatus. Therefore, characteristics of the semiconductor memory apparatus at the target frequency in the wafer level may not be properly tested. In order to cope with this problem, a conventional semiconductor memory apparatus is often tested twice: once in the wafer level for normal operations of a cell and basic characteristics, such as a current performance requirements, which may be tested at a low frequency, and the second test is performed in the package level where input/output line coupling effect and a pipe latch strobe signal timing margin are checked at the target frequency by inputting a high speed clock. However, the lack of feasible evaluation measures of operation characteristics at the target frequency in the wafer level, as in this case, means that disqualifying memory chips whose operation characteristics do not meet the performance requirements cannot be filtered in advance, and a packaging process should be performed again for such disqualifying memory chips. This leads to the decreased manufacturing yield of packages and the increased manufacturing cost. Further, in the case of a product such as a TSV (through-silicon via) product in which a plurality of wafer chips are connected in parallel, a plurality of good wafer chips may be classified as bad wafer chips, due to the presence of bad wafer chips which have not been filtered in the wafer level in advance. Moreover, when considering that a semiconductor memory apparatus may not undergo a packaging process and may be placed on a market as a wafer level product, if characteristics cannot be fully evaluated in the wafer level as described above, quality reliability of the product is likely to deteriorate. Thus, the semiconductor memory apparatus should be tested using another test equipment capable of performing a test at the target frequency even in the wafer level, which increases a manufacturing period and a manufacturing cost.

FIG. 1 is a schematic block diagram illustrating components which generate a DLL (delay-locked loop) input clock and an AC input clock, i.e., an address and command input clock, in a conventional semiconductor memory apparatus. The conventional semiconductor memory apparatus receives an external clock clk_ex through a clock buffer 1 and generates a normal clock clk_n as an internal clock signal. The normal clock clk_n is inputted to a DLL circuit unit 2 and an AC circuit unit 3. The DLL circuit unit 2 and the AC (address/command) circuit unit 3 perform operations in synchronization with the inputted normal clock clk_n. The DLL circuit unit 2 is a component which includes a delay-locked loop circuit and is configured to generate a DLL clock according to the inputted normal clock clk_n and determine a data output timing. The AC circuit unit 3 is a component which is configured to receive an address signal and a command signal from outside and generate an internal address signal and an internal command signal.

SUMMARY

In one embodiment of the present invention, a semiconductor memory apparatus includes: a clock control unit configured to receive a first clock when an enable signal is activated and generate a second clock which has a cycle closer in length to a predetermined clock cycle than the first clock; and an address/command input clock generation unit configured to output one of the first clock and the second clock as an address/command input clock according to the enable signal.

In another embodiment of the present invention, a semiconductor memory apparatus includes: a clock control unit configured to receive a first clock when an enable signal is activated and generate a second clock which has a shorter clock cycle than the first clock; and a DLL input clock generation unit configured to output one of the first clock and the second clock as a DLL input clock according to a DLL select signal.

In another embodiment of the present invention, a semiconductor memory apparatus includes: a clock control unit configured to receive a first clock when an enable signal is activated and generate a second clock which has a cycle closer in length to a predetermined clock cycle than the first clock; a DLL input clock generation unit configured to output one of the first clock and the second clock as a DLL input clock according to a DLL select signal; and an address/command input clock generation unit configured to output one of the first clock and the second clock as an address/command input clock according to the enable signal.

In another embodiment of the present invention, a semiconductor memory apparatus includes: a clock control unit configured to receive a first clock and generate a second clock which has a cycle closer in length to a target clock cycle than the first clock; a DLL input clock generation unit configured to output the first clock as a DLL input clock; an address/command input clock generation unit configured to output the second clock as an address/command input clock; and a burst length exchanger configured to change sequence of burst length signals.

In another embodiment of the present invention, a method for testing a semiconductor memory apparatus includes the steps of: receiving a first clock and generating a second clock which has a cycle closer in length to a predetermined clock cycle than the first clock; and outputting the second clock as a DLL input clock and an address/command input clock.

In another embodiment of the present invention, a method for testing a semiconductor memory apparatus includes the steps of: receiving a first clock and generating a second clock which has a cycle closer in length to a predetermined clock cycle than the first clock; and outputting the second clock as an address/command input clock and the first clock as the DLL input clock.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a test method thereof according to the present invention will be described below with reference to the accompanying drawings through exemplary embodiments.

A semiconductor memory apparatus in accordance with an embodiment of the present invention is configured to receive a normal clock (hereinafter, referred to as a 'first clock') with a cycle longer than that of a target clock with which the semiconductor memory apparatus is to operate in a packaged state, generate a high speed clock (hereinafter, referred to as a 'second clock') with a cycle closer in length to the target clock than the external clock, and appropriately transfer the first clock and the second clock to a DLL circuit unit and an AC circuit unit, so that target frequency operation characteristics of the semiconductor memory apparatus may be evaluated by an outmoded wafer test equipment.

Figure 2:
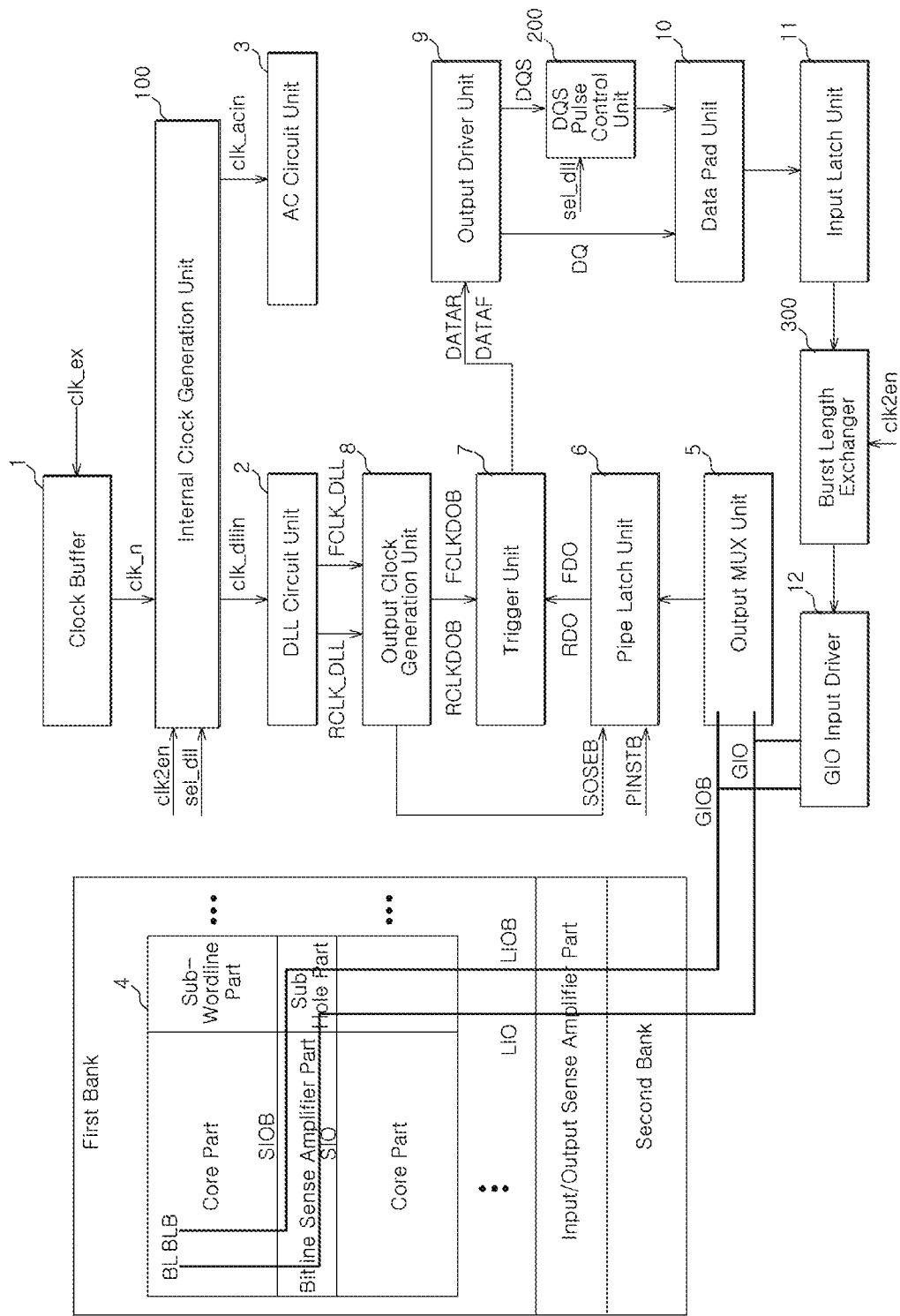
FIG. 2 is a block diagram illustrating a flow of overall operations along which a semiconductor memory apparatus in accordance with an embodiment of the present invention operates in response to read/write commands.

FIG. 2 is a block diagram illustrating a flow of overall operations along which a semiconductor memory apparatus in accordance with an embodiment of the present invention operates in response to read/write commands.

In the semiconductor memory apparatus in accordance with the embodiment of the present invention, the components other than an internal clock generation unit 100, a DQS pulse control unit 200, and a burst length exchanger 300 may be configured in the same manner as in the conventional semiconductor memory apparatus.

Figure 1:
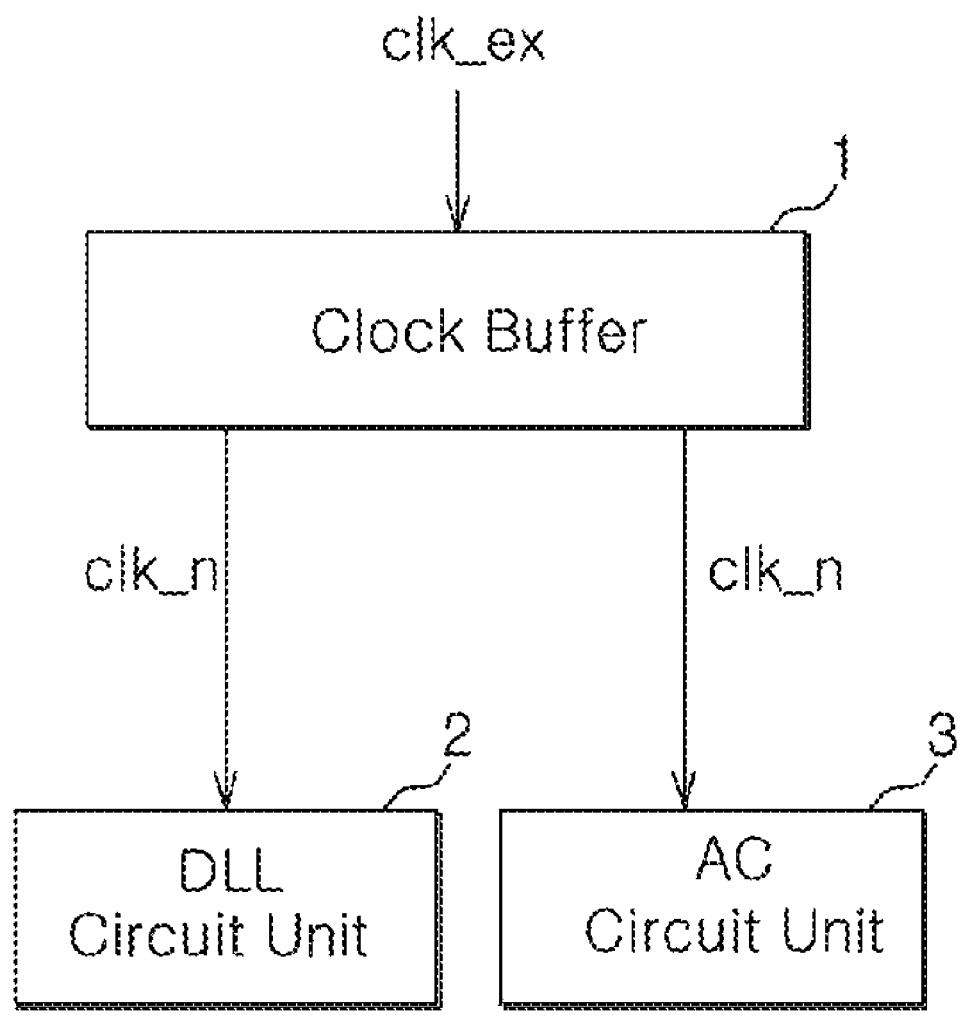
FIG. 1 is a schematic block diagram illustrating components which generate a DLL input clock and an AC input clock in a conventional semiconductor memory apparatus.

The internal clock generation unit 100 is configured to receive a first clock clk_n which is generated by a clock buffer 1 that has received an external clock clk_ex, and generate a DLL input clock clk_dllin and an AC input clock clk_acin which are respectively inputted to a DLL circuit unit 2 and an AC circuit unit 3. Unlike the conventional art shown in FIG. 1 in which the first clock clk_n is inputted to the DLL circuit unit 2 and the AC circuit unit 3, in the semiconductor memory apparatus in accordance with the embodiment of the present invention shown in FIG. 2, the internal clock generation unit 100 generates the DLL input clock clk_dllin and the AC input clock clk_acin and provides the generated DLL input clock clk_dllin and AC input clock clk_acin to the DLL circuit unit 2 and the AC circuit unit 3, respectively. Operations and constructions of the internal clock generation unit 100, the DQS pulse control unit 200, and the burst length exchanger 300 will be described later with reference to FIG. 3.

If a read command is inputted for a read operation of the semiconductor memory apparatus, the AC circuit unit 3 receives an output command and an output address signals which are inputted from outside, and generates an internal output command and an internal output address signals through arithmetic operations synchronized with the AC input clock clk_acin. The semiconductor memory apparatus outputs the data stored in a core unit 4 to a bit line pair BL and BLB in response to the internal output command and the internal output address signals. The data loaded on the bit line pair BL and BLB are applied to a global input/output line pair GIO and GIOB through a segment input/output line pair SIO and SIOB and a local input/output line pair LIO and LIOB. An output MUX unit 5 outputs the data applied to the global input/output line pair GIO and GIOB to a pipe latch unit 6. The pipe latch unit 6 receives and latches the data when a pipe latch strobe signal PINSTB is activated, and transfers the data to a trigger unit 7 as first data RDO and second data FDO. The output of the plurality of data RDO and FDO by the pipe latch unit 6 is implemented in consideration of a DDR (double data rate) structure.

As the read command is inputted, the DLL circuit unit 2 generates a first DLL clock RCLK_DLL and a second DLL clock FCLK_DLL according to the inputted DLL input clock clk_dllin. The generation of the plurality of DLL clocks RCLK_DLL and FCLK_DLL by the DLL circuit unit 2 is also implemented in consideration of the DDR structure. The first DLL clock RCLK_DLL and the second DLL clock FCLK_DLL are inputted to an output clock generation unit 8 and are converted into a first output clock RCLKDOB and a second output clock FCLKDOB which have information of data output timings. The output clock generation unit 8 transfers the first output clock RCLKDOB and the second output clock FCLKDOB to the trigger unit 7 for data output. Further, the output clock generation unit 8 outputs to the pipe latch unit 6 an output start signal SOSEB which is a signal for controlling the pipe latch unit 6 to output the first data RDO and the second data FDO to the trigger unit 7.

As described above, by the read command, the first output clock RCLKDOB and the second output clock FCLKDOB for the data output timings are inputted from the output clock generation unit 8 to the trigger unit 7, and the first data RDO and the second data FDO are inputted from the pipe latch unit 6 to the trigger unit 7 as output data. The trigger unit 7 outputs the first data RDO and the second data FDO to an output driver unit 9 as first output data DATAR and second output data DATAF in synchronization with the first output clock RCLKDOB and the second output clock FCLKDOB. The output driver unit 9 includes a data output driver for outputting data DQ and a data strobe signal output driver (hereinafter, referred to as a 'DQS output driver') 9-1 (see FIG. 4b) for outputting a data strobe signal DQS. A data pad unit 10 includes a data pad and a data strobe signal pad 10-1 (see FIG. 4b). Accordingly, the output driver unit 9 outputs the data DQ to the data pad and outputs the data strobe signal DQS according to the first output data DATAR and the second output data DATAF. The data strobe signal DQS is inputted to the data strobe signal pad 10-1 through the DQS pulse control unit 200 or inputted directly to the data strobe signal pad 10-1. The DQS pulse control unit 200 is a component which may be omitted depending upon a configuration of the invention, and will be described in detail with reference to FIG. 4b.

If a write command is inputted for write operation of the semiconductor memory apparatus, data inputted in series to the data pad unit 10 are applied to and stored in an input latch unit 11. The data stored in the input latch unit 11 are applied in parallel to a global input/output line input driver (hereinafter, referred to as a 'GIO input driver') 12 by passing or not passing through a burst length exchanger 300. The burst length exchanger 300 is a component which may be necessary depending upon the field of a test and may be omitted depending upon the configuration of the field of the test, which will be described in detail with reference to FIGS. 6a and 6b. The GIO input driver 12 applies the inputted parallel data to the global input/output line pair GIO and GIOB. Conversely to the read operation as described above, the data are stored in the core unit 4 via the global input/output line pair GIO and GIOB, the local input/output line pair LIO and LIOB, the segment input/output line pair SIO and SIOB, and the bit line pair BL and BLB.

Figure 3:
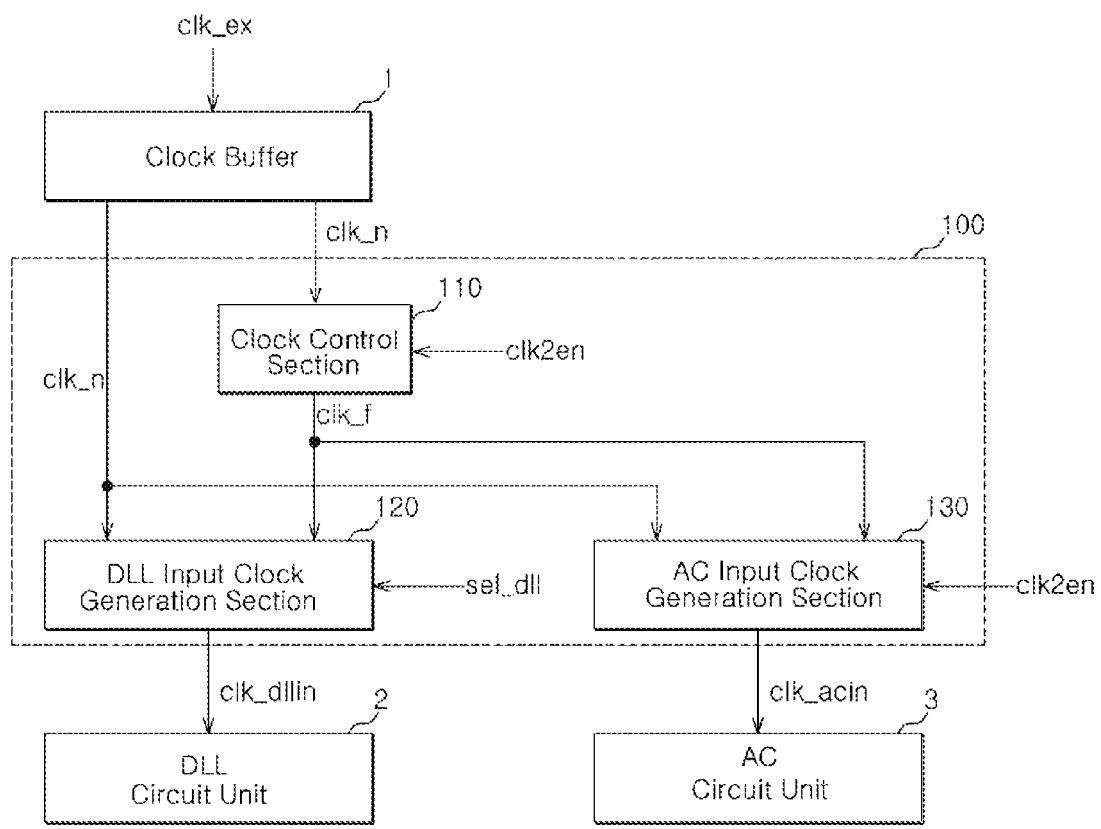
FIG. 3 is a block diagram illustrating together in detail the internal clock generation unit, the DLL circuit unit and the AC circuit unit shown in FIG. 2.

FIG. 3 is a block diagram illustrating collectively in detail the internal clock generation unit 100, the DLL circuit unit 2 and the AC circuit unit 3 shown in FIG. 2.

The internal clock generation unit 100 may include a clock control section 110, a DLL input clock generation section 120 and an AC input clock generation section 130. The semiconductor memory apparatus has a clock corresponding to a frequency at which it will operate in a packaged state. For the sake of convenience in explanation, the clock will be referred to as a target clock.

The clock control section 110 receives the first clock clk_n (the same as the normal clock in the conventional art) which is outputted from the clock buffer 1, when an enable signal clk2en is activated, and generates a second clock clk_f which has a cycle closer in length to the target clock than the first clock clk_n.

The DLL input clock generation section 120 is configured to output one of the first clock clk_n and the second clock clk_f as the DLL input clock clk_dllin according to a DLL select signal sel_dll. The DLL input clock generation section 120 may include a MUX circuit which is configured to select and output one of the first clock clk_n and the second clock clk_f according to the DLL select signal sel_dll.

The AC input clock generation section 130 is configured to output one of the first clock clk_n and the second clock clk_f as the AC input clock clk_acin according to the enable signal clk2en. The AC input clock generation section 130 may include a MUX circuit which is configured to select and output one of the first clock clk_n and the second clock clk_f according to the enable signal clk2en.

Depending upon which one of the first clock clk_n and the second clock clk_f is selected and outputted by each of the DLL input clock generation section 120 and the AC input clock generation section 130, a speed, at which each of the DLL circuit unit 2 and the AC circuit unit 3 operates, varies, and an equipment for testing the semiconductor memory apparatus may check characteristics in each case. Accordingly, the semiconductor memory apparatus shown in FIG. 3 may operate under different modes depending upon the DLL select signal sel_dll and the enable signal clk2en, and the equipment for testing the semiconductor memory apparatus may check characteristics in respective modes. Modes, under which the semiconductor memory apparatus operates, are as described below.

The semiconductor memory apparatus may operate under a DLL characteristic test mode. When the DLL input clock generation section 120 outputs the second clock clk_f as the DLL input clock clk_dllin and the AC input clock generation section 130 outputs the second clock clk_f as the AC input clock clk_acin, the semiconductor memory apparatus operates under the DLL characteristic test mode. Because both the DLL input clock clk_dllin and the AC input clock clk_acin are the second clock clk_f which has a speed higher than the first clock clk_n, both the DLL circuit unit 2 and the AC circuit unit 3 operate at high speeds. In the DLL characteristic test mode, the equipment for testing the semiconductor memory apparatus may check characteristics related with the first and second DLL clocks RCLK_DLL and FCLK_DLL which are generated when the DLL circuit unit 2 operates at the high speed. As the equipment for testing the semiconductor memory apparatus causes the data strobe signal DQS, of which timing is determined depending upon the first and second DLL clocks RCLK_DLL and FCLK_DLL, to be outputted by swinging, receives the data strobe signal DQS through the data strobe signal pad 10-1 (see FIG. 4b) and compares the data strobe signal DQS with the external clock clk_ex, the equipment for testing the semiconductor memory apparatus may check characteristics when the DLL circuit unit 2 operates at the high speed.

Figure 4A:
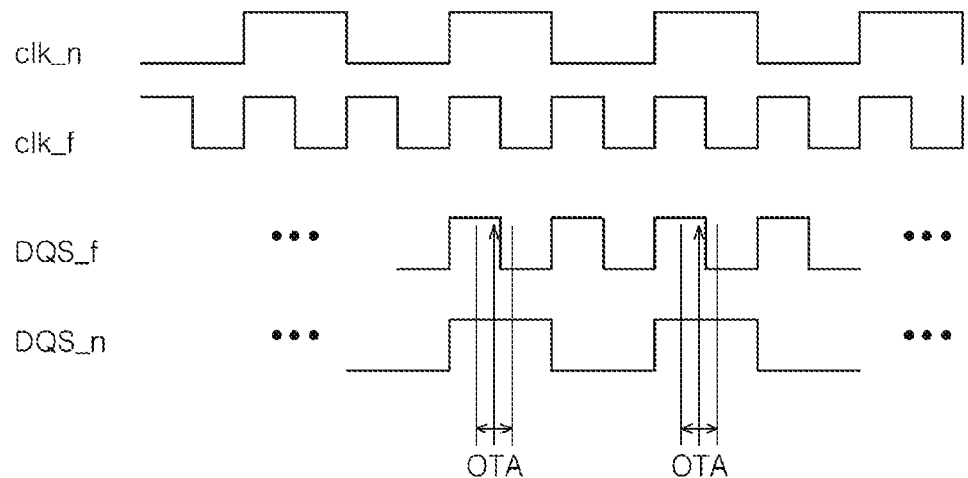
FIG. 4a is a diagram illustrating the waveforms of a data strobe signal depending upon an operation speed of the DLL circuit unit.

As described above, in the DLL characteristic test mode, the equipment for testing the semiconductor memory apparatus receives the data strobe signal DQS through the data strobe signal pad 10-1. Here, a person skilled in the art should check if the equipment for testing the semiconductor memory apparatus may recognize the data strobe signal DQS which is outputted from the data strobe signal pad 10-1 when the DLL circuit unit 2 operates at the high speed. FIG. 4a is a waveform diagram of a data strobe signal (hereinafter, referred to as a 'high speed data strobe signal') DQS_f which is outputted by being determined in the timing thereof according to the first and second DLL clocks RCLK_DLL and FCLK_DLL generated when the DLL circuit unit 2 receives the second clock clk_f as the DLL input clock clk_dllin and operates at the high speed, and a data strobe signal (hereinafter, referred to as a 'normal data strobe signal') DQS_n which is outputted by being determined in the timing thereof according to the first and second DLL clocks RCLK_DLL and FCLK_DLL generated when the DLL circuit unit 2 receives the first clock clk_n as the DLL input clock clk_dllin and operates at a low speed. The equipment for testing the semiconductor memory apparatus senses the data strobe signal DQS inputted thereto at a specified timing. The accuracy of the specified timing which is set to the equipment for testing the semiconductor memory apparatus is called an OTA (overall timing accuracy). In order for the equipment for testing the semiconductor memory apparatus to normally recognize the high speed data strobe signal DQS_f, the pulse width of the high speed data strobe signal DQS_f should match the OTA. If the OTA and the pulse width of the high speed data strobe signal DQS_f match each other, the equipment for testing the semiconductor memory apparatus may test the DLL characteristics without any problems. Conversely, if the OTA and the pulse width of the high speed data strobe signal DQS_f mismatch each other as shown in FIG. 4a, the pulse width of the high speed data strobe signal DQS_f may be controlled (for example, into the same type as the normal data strobe signal DQS_n of FIG. 4a) in such a manner that it can be recognized by the equipment for testing the semiconductor memory apparatus. The control of the data strobe signal DQS is enabled by additionally providing the DQS pulse control unit 200 to the semiconductor memory apparatus. By controlling the pulse width of the data strobe signal DQS to allow the equipment for testing the semiconductor memory apparatus to recognize the data strobe signal DQS, the operation under the DLL characteristic test mode may be enabled.

Figure 4B:
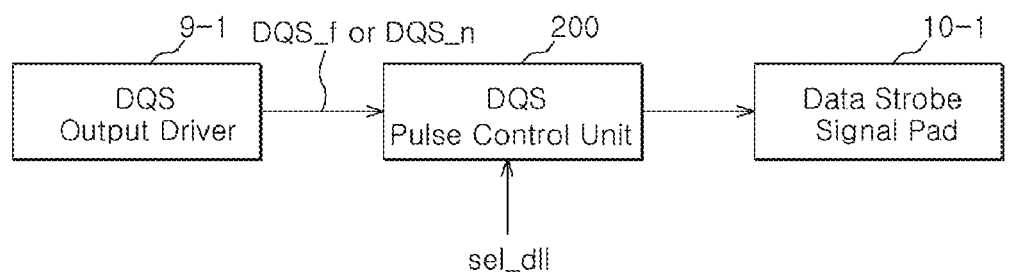
FIG. 4b is a block diagram illustrating together a DQS pulse control unit, a DQS output driver, and a data strobe signal pad.

FIG. 4b is a schematic block diagram which illustrates the DQS pulse control unit 200 along with the DQS output driver 9-1 and the data strobe signal pad 10-1 to explain the operation of the DQS pulse control unit 200. The DQS pulse control unit 200 may be configured to be connected between the DQS output driver 9-1 for generating the data strobe signal DQS and the data strobe signal pad 10-1. The data strobe signal DQS, which is inputted to the DQS pulse control unit 200, is the high speed data strobe signal DQS_f when the DLL circuit unit 2 operates at the high, speed and is the normal data strobe signal DQS_n when the DLL circuit unit 2 operates at the low speed. Thus, the DQS pulse control unit 200 is configured to output the data strobe signal DQS_f or DQS_n inputted thereto according to the DLL select signal sel_dll by controlling or not controlling the pulse width thereof. Since the data strobe signal DQS is the high speed data strobe signal DQS_f when the DLL select signal sel_dll is activated, the DQS pulse control unit 200 may be configured to output the inputted high speed data strobe signal DQS_f by controlling the pulse width thereof such that the equipment for testing the semiconductor memory apparatus may recognize the high speed data strobe signal DQS_f without any problems. Conversely, since the data strobe signal DQS is the normal data strobe signal DQS_n when the DLL select signal sel_dll is deactivated, the DQS pulse control unit 200 may be configured to output the inputted normal data strobe signal DQS_n as it is, without controlling the pulse width thereof. The DQS pulse control unit 200 may include a flip-flop circuit which is configured to receive the data strobe signal DQS_n or DQS_f. Specifically, the rate at which the DQS pulse control unit 200 controls the pulse width of the data strobe signal DQS may be determined to be the same as the rate between the cycle of the second clock clk_f and the cycle of the first clock clk_n. This is to recognize the data strobe signal DQS which has a pulse width corresponding to the first clock clk_n inputted from the equipment for testing the semiconductor memory apparatus. For example, if the cycle of the first clock clk_n is two times the cycle of the second clock clk_f, the DQS pulse control unit 200 may be configured to increase by two times the pulse width of the data strobe signal DQS.

Further, the semiconductor memory apparatus may operate under a timing margin test mode. When the DLL input clock generation section 120 outputs the first clock clk_n as the DLL input clock clk_dllin and the AC input clock generation section 130 outputs the second clock clk_f as the AC input clock clk_acin, the semiconductor memory apparatus operates under the timing margin test mode. Since the AC input clock clk_acin is the second clock clk_f, that is, a higher speed clock than the first clock clk_n, the AC circuit unit 3 operates at the high speed. Since the DLL input clock clk_dllin is the first clock clk_n, that is, a lower speed clock than the second clock clk_f, the DLL circuit unit 2 operates at the low speed. As described above, in the read operation of the semiconductor memory apparatus, the data stored in the core unit 4 are loaded on the output MUX unit 5 via the global input/output line GIO and are transferred to the pipe latch unit 6 when the pipe latch strobe signal PINSTB is activated. A timing margin test is a test for checking how accurately the pipe latch strobe signal PINSTB is activated. In the timing margin test, the equipment for testing the semiconductor memory apparatus checks whether the pipe latch strobe signal PINSTB is precisely activated as the AC circuit unit 3 operates at the high speed and the data applied at the high speed are transferred to the pipe latch unit 6 without any problems. In the timing margin test, because the DLL circuit unit 2 operates at the low speed, that is, a condition more advantageous than the high speed, the timing margin test is a test which is concentrated on checking a timing margin between the pipe latch strobe signal PINSTB and the data applied to the data MUX unit 5. In the timing margin test, since the DLL circuit unit 2 operates at the low speed, the equipment for testing the semiconductor memory apparatus may recognize the data without considering the control of the OTA and the pulse width according to the high speed operation of the DLL circuit unit 2 as described above. Accordingly, in the timing margin test, the DQS pulse control unit 200, which may be necessary in the DLL characteristic test, is not needed. Since the timing characteristic test is a test under which the AC circuit unit 3 operates at the high speed, the characteristic of a time from an active signal to a next active signal, that is, a tAC, may be checked too.

Also, when the semiconductor memory apparatus operates under the timing margin test mode, an input/output line coupling effect characteristic may be tested. Because the AC circuit unit 3 operates at the high speed as the AC input clock generation section 130 generates the second clock clk_f, the signals applied to input/output lines are transferred at the high speed as well. When the semiconductor memory apparatus includes the burst length exchanger 300 as shown in FIG. 2, the input/output line coupling effect characteristic may be tested more sensitively. The input/output line coupling effect occurs to a greater extent in the case where the voltage levels of adjacent input/output lines are opposite to each other and as the voltage levels of the adjacent input/output lines swing faster. Due to this fact, when testing the input/output line coupling effect, the burst length of inputted data is controlled and the waveforms of the signals applied to the adjacent input/output lines have different voltage levels of high and low levels, whereby it is possible to check the coupling effect under a worst condition. How the worst condition for the input/output line coupling effect test is created as the burst length is controlled and a circuit diagram according to one embodiment of the burst length exchanger 300 will be described later with reference to FIGS. 6a and 6b.

In addition, the semiconductor memory apparatus may operate under a normal test mode. When the DLL input clock generation section 120 outputs the first clock clk_n as the DLL input clock clk_dllin and the AC input clock generation section 130 outputs the first clock clk_n as the AC input clock clk_acin, the semiconductor memory apparatus operates under the normal characteristic test mode. In the normal characteristic test mode, since both the DLL input clock clk_dllin and the AC input clock clk_acin are first clock clk_n, operations of the DLL circuit unit 2 and the AC circuit unit 3 are implemented at the low speed as in the case of operations of the DLL circuit unit 2 and the AC circuit unit 3 according to the conventional art. The normal test includes a core test, a test for asynchronous characteristics not substantially related with clock speeds, such as tRCD, tRP, tWR and tAA, which are administrated according to a specification of a product, an IDD test, and so forth.

Figure 5:
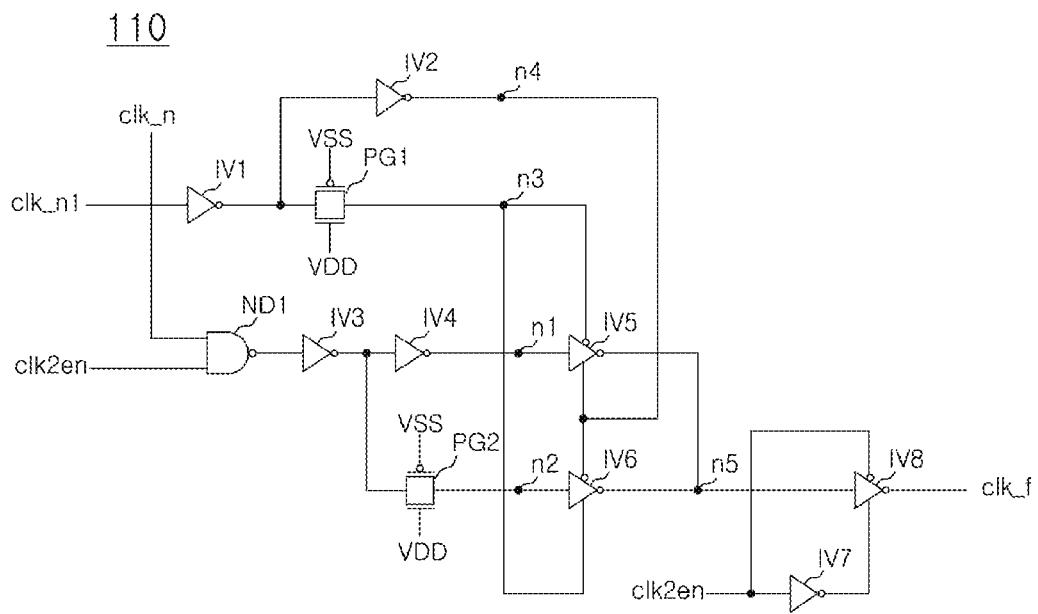
FIG. 5 is a circuit diagram illustrating one embodiment of the clock control section shown in FIG. 3.

FIG. 5 is a circuit diagram illustrating one embodiment of the clock control section 110 shown in FIG. 3.

The clock control section 110 shown in FIG. 5 is configured to generate a clock signal which has a cycle corresponding to one half of the cycle of the first clock clk_n, as the second clock clk_f. The clock control section 110 may include first through eighth inverters IV1 through IV8, first and second pass gates PG1 and PG2, and a first NAND gate ND1. A delayed clock clk_n1 shown in FIG. 5 is a clock which is delayed by 90° in phase when compared to the first clock clk_n.

If the enable signal clk2en is activated, an inverted signal of the first clock clk_n is applied to a first node n1. Also, if the enable signal clk2en is activated, the first clock clk_n is applied to a second node n2. An inverted signal of the delayed clock clk_n1 is applied to a third node n3. The delayed clock clk_n1 is applied to a fourth node n4. The fifth and sixth inverters IV5 and IV6 as tri-state inverters are alternately activated according to the delayed clock clk_n1 and the inverted signal of the delayed clock clk_n1, respectively. The inverted signal of the first clock clk_n applied to the first node n1 or the first clock clk_n applied to the second node n2 is applied to a fifth node n5 according to the level of the delayed clock clk_n1. The signal applied to the fifth node n5 is outputted as the second clock clk_f by passing through the eighth inverter IV8 which is activated by the enable signal clk2en. With the operation of the clock control section 110, the second clock clk_f becomes a signal which has a cycle corresponding to one half of the cycle of the first clock clk_n.

Figure 6A:
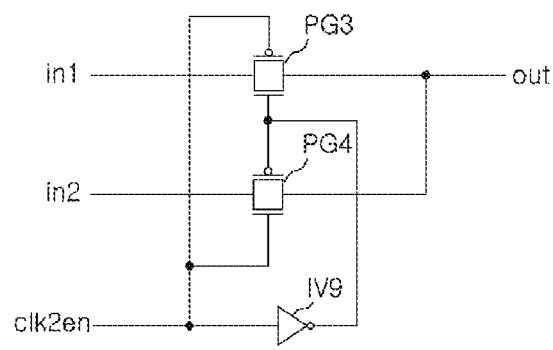
FIG. 6a is a circuit diagram illustrating one embodiment of a burst length exchanger.
Figure 6B:
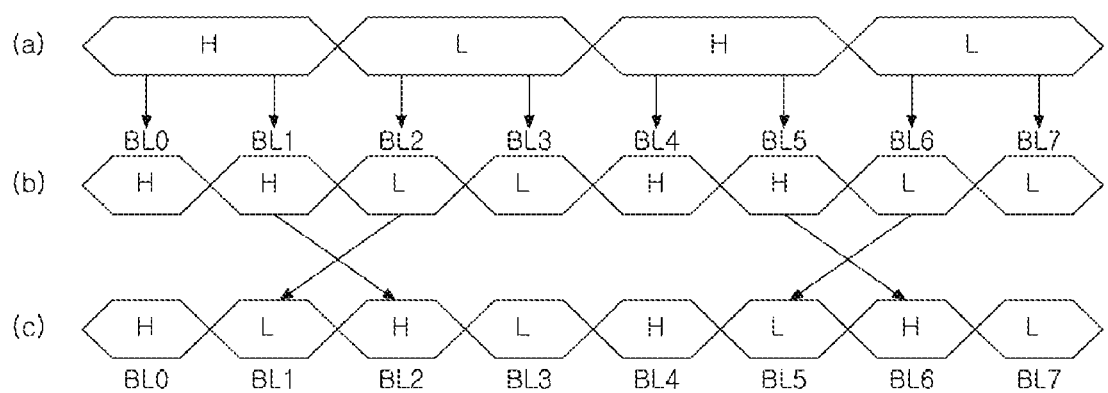
FIG. 6b is a diagram illustrating the waveforms of signals which are applied to input/output lines according to operations of the burst length exchanger.

FIG. 6a is a circuit diagram illustrating one embodiment of the burst length exchanger 300, and FIG. 6b is a diagram illustrating the waveforms of signals which are applied to input/output lines according to operations of the burst length exchanger 300.

Referring to FIG. 6a, the burst length exchanger 300 includes third and fourth pass gates PG3 and PG4 and a ninth inverter IV9. The third pass gate PG3 receives a first input in1 and is activated when the enable signal clk2en is deactivated. The fourth pass gate PG4 receives a second input in2 and is activated when the enable signal clk2en is activated. The burst length exchanger 300 selects one of the first input in1 and the second input in2 according to the enable signal clk2en and outputs the selected one as an output signal 'out'.

Referring to FIG. 6b, waveform (a) shows the waveform of data which is inputted by the test equipment to the semiconductor memory apparatus. From the waveform (a), it is to be appreciated that the data swings to high and low levels so as to check the coupling effect of the input/output lines under a bad condition. Waveform (b) shows the waveform of data when the semiconductor memory apparatus operates under the timing margin test mode in a state in which the burst length exchanger 300 is not included in the semiconductor memory apparatus. Since the AC circuit unit 3 operates at the high speed in the timing margin test mode, the waveform of data as shown in (b) is acquired by receiving twice one pulse of the signal inputted as shown in (a). From the waveform (b), it is to be appreciated that first through eighth burst lengths BL0 through BL8 swing by repeating two high levels and two low levels. Waveform (c) shows the waveform of data when the semiconductor memory apparatus operates under the timing margin test mode in a state in which the semiconductor memory apparatus shown in FIG. 3 includes a plurality of burst length exchangers 300. In the waveform (c), the second and third burst lengths BL1 and BL2 of the waveform (b) are exchanged with each other and are outputted in the sequence of the third and second burst lengths BL2 and BL1. The sixth and seventh burst lengths BL5 and BL6 of the waveform (b) are applied to the waveform (c) by being also exchanged with each other. Through these exchanges, the waveform (c) swings by repeating one high level and one low level. If burst length data of the waveform (c) are loaded on input lines, as the voltage levels of adjacent lines become opposite to each other, a bad condition for coupling effect is created. In order to realize a waveform such as the waveform (c), a plurality of burst length exchanger 300 as shown in FIG. 6a may be disposed between the input latch unit 11 and the GIO input driver 12 as shown in FIG. 2 to be connected in parallel, such that the second and third burst lengths BL1 and BL2 of the parallel data stored in the input latch unit 11 are received as the first input in1 and the second input in2 according to the enable signal clk2en and are outputted to a second burst length terminal of the GIO input driver 12, and the third and second burst lengths BL2 and BL1 are received as the first input in1 and the second input in1 and are outputted to a third burst length terminal of the GIO input driver 12. The sixth and seventh burst lengths BL5 and BL6 may be configured in the same manner as the second and third burst lengths BL1 and BL2.

As is apparent from the above description, the semiconductor memory apparatus in accordance with the embodiment of the present invention may operate under a DLL characteristic test mode, a timing margin test mode, and a normal test mode. Due to this fact, even when an equipment for testing the semiconductor memory apparatus inputs a low speed clock (corresponding to the first clock clk_n in the embodiment of the present invention) to perform a test, a high speed clock (corresponding to the second clock clk_f in the embodiment of the present invention) may be internally generated to perform the test. In other words, even in an outmoded semiconductor memory test equipment which does not support a high speed clock, both high speed operation characteristics and low speed operation characteristics of a semiconductor memory apparatus which has a high speed clock as a target clock may be tested. This feature achieves effects of improving and increasing the compatibility and the lifetime of a semiconductor memory apparatus manufacturing equipment, whereby the productivity and the manufacturing cost of a semiconductor memory apparatus may be respectively increased and reduced.

While certain embodiments have been described above, it will be understood to those skilled in the art that the embodiments described are by way of example only. Accordingly, the semiconductor memory apparatus and the test method thereof described herein should not be limited based on the described embodiments. Rather, the semiconductor memory apparatus and the test method thereof described herein should only be limited in light of the claims that follow when taken in conjunction with the above description and accompanying drawings.

What is claimed is:

1. A semiconductor memory apparatus comprising:
    a clock control unit configured to receive a first clock when an enable signal is activated and generate a second clock which has a cycle closer in length to a predetermined clock cycle than the first clock; and
    an address/command input clock generation unit configured to output one of the first clock and the second clock as an address/command input clock according to the enable signal.

2. The semiconductor memory apparatus according to claim 1, wherein a test is performed as the address/command input clock generation unit outputs the second clock as the address/command input clock.

3. The semiconductor memory apparatus according to claim 2, further comprising:
a burst length exchanger configured to receive the enable signal and change sequence of burst length signals.

4. The semiconductor memory apparatus according to claim 3, wherein the burst length exchanger is configured to change the sequence of the burst length signals such that adjacent burst length signals have opposite voltage levels.

5. The semiconductor memory apparatus according to claim 1, wherein the predetermined clock cycle is the same as a cycle of a clock signal which is received by the semiconductor memory apparatus from outside in a normal operation.

6. The semiconductor memory apparatus according to claim 5, wherein the cycle of the second clock corresponds to one half of the cycle of the first clock.

7. A semiconductor memory apparatus comprising:
a clock control unit configured to receive a first clock when an enable signal is activated and generate a second clock which has a cycle closer to a target clock cycle than the first clock; and
a DLL input clock generation unit configured to output one of the first clock and the second clock as a DLL input clock according to a DLL select signal.

8. The semiconductor memory apparatus according to claim 7, further comprising:
a data strobe signal pulse control unit configured to control a pulse width of a data strobe signal in response to the DLL select signal and output the resultant data strobe signal.

9. The semiconductor memory apparatus according to claim 8, wherein a rate at which the data strobe signal pulse control unit controls the pulse width of the data strobe signal is determined to be the same as a rate between the cycle of the second clock and the cycle of the first clock.

10. The semiconductor memory apparatus according to claim 7, wherein the target clock cycle is the same as a cycle of a clock signal which is received by the semiconductor memory apparatus from an outside in a normal operation.

11. The semiconductor memory apparatus according to claim 10, wherein the cycle of the second clock corresponds to one half of the cycle of the first clock.

12. A semiconductor memory apparatus comprising:
a clock control unit configured to receive a first clock when an enable signal is activated and generate a second clock which has a cycle closer in length to a predetermined clock cycle than the first clock;
a DLL input clock generation unit configured to output one of the first clock and the second clock as a DLL input clock according to a DLL select signal; and
an address/command input clock generation unit configured to output one of the first clock and the second clock as an address/command input clock according to the enable signal.

13. The semiconductor memory apparatus according to claim 12, wherein a test is performed as the DLL input clock generation unit and the address/command input clock generation unit output the second clock as the DLL input clock and the address/command input clock, respectively.

14. The semiconductor memory apparatus according to claim 13, further comprising:
a data strobe signal pulse control unit configured to control a pulse width of a data strobe signal in response to the DLL select signal and output the resultant data strobe signal.

15. The semiconductor memory apparatus according to claim 14, wherein a rate at which the data strobe signal pulse control unit controls the pulse width of the data strobe signal is determined to be the same as a rate between the cycle of the second clock and the cycle of the first clock.

16. The semiconductor memory apparatus according to claim 12, wherein a test is performed as the address/command input clock generation unit outputs the second clock as the address/command input clock and the DLL input clock generation unit outputs the first clock as the DLL input clock.

17. The semiconductor memory apparatus according to claim 12, further comprising:
a burst length exchanger configured to receive the enable signal and change sequence of burst length signals.

18. The semiconductor memory apparatus according to claim 17, wherein the burst length exchanger is configured to change the sequence of the burst length signals such that adjacent burst length signals have opposite voltage levels.

19. The semiconductor memory apparatus according to claim 17, wherein an input/output line coupling test operation is additionally performed when the address/command input clock generation unit outputs the second clock as the address/command input clock and the DLL input clock generation unit outputs the first clock as the DLL input clock.

20. The semiconductor memory apparatus according to claim 12, wherein a test is performed as the first clock is outputted as the address/command input clock and the first clock is outputted as the DLL input clock according to the DLL select signal and the enable signal.

21. The semiconductor memory apparatus according to claim 12, wherein the predetermined clock cycle is the same as a cycle of a clock signal which is received by the semiconductor memory apparatus from outside in a normal operation.

22. The semiconductor memory apparatus according to claim 21, wherein the cycle of the second clock corresponds to one half of the cycle of the first clock.

23. A semiconductor memory apparatus comprising:
a clock control unit configured to receive a first clock and generate a second clock which has a cycle closer in length to a target clock cycle than the first clock;
a DLL input clock generation unit configured to output the first clock as a DLL input clock;
an address/command input clock generation unit configured to output the second clock as an address/command input clock; and
a burst length exchanger configured to change sequence of burst length signals.

24. The semiconductor memory apparatus according to claim 23, wherein the burst length exchanger is configured to change the sequence of the burst length signals such that adjacent burst length signals have opposite voltage levels.

25. The semiconductor memory apparatus according to claim 23, wherein the target clock cycle is the same as a cycle of a clock signal which is received by the semiconductor memory apparatus from outside in a normal operation.

26. The semiconductor memory apparatus according to claim 25, wherein the cycle of the second clock corresponds to one half of the cycle of the first clock.

27. A method for testing a semiconductor memory apparatus, comprising the steps of:
is receiving a first clock and generating a second clock which has a cycle closer in length to a predetermined clock cycle than the first clock; and outputting the second clock as a DLL input clock and an address/command input clock.

28. The method according to claim 27, wherein the step of generating the second clock is implemented to generate the second clock by combining the first clock and a clock acquired by shifting a phase of the first clock by 90°.

29. The method according to claim 27, further comprising the step of:
controlling a pulse width of a data strobe signal and outputting the resultant data strobe signal.

30. The method according to claim 29, wherein, in the step of controlling the pulse width of the data strobe signal and outputting the resultant data strobe signal, a rate at which the pulse width of the data strobe signal is controlled is the same as a rate between the cycle of the second clock and the cycle of the first clock.

31. The method according to claim 29,
wherein the step of outputting the second clock as the DLL input is clock and the address/command input clock is implemented to output the second clock as the DLL input clock in response to a DLL select signal; and
wherein the step of controlling the pulse width of the data strobe signal and outputting the resultant data strobe signal is implemented to control the pulse width of the data strobe signal in response to the DLL select signal.

32. The method according to claim 29,
wherein the step of controlling the pulse width of the data strobe signal and outputting the resultant data strobe signal is implemented through a data strobe signal pulse control unit; and
wherein the data strobe signal pulse control unit is connected between a data strobe signal output driver and a data strobe signal pad of the semiconductor memory apparatus.

33. The method according to claim 27, wherein the predetermined clock cycle is the same as a cycle of a clock signal which is received by the semiconductor memory apparatus from outside in a normal operation.

34. The method according to claim 33, wherein the cycle of the second clock corresponds to one half of the cycle of the first clock.

35. A method for testing a semiconductor memory apparatus, comprising the steps of:
receiving a first clock and generating a second clock which has a cycle closer in length to a predetermined clock cycle than the first clock; and
outputting the second clock as an address/command input clock and the first clock as a DLL input clock.

36. The method according to claim 35, wherein the step of generating the second clock is implemented to generate the second clock by combining the first clock and a clock acquired by shifting a phase of the first clock by 90°.

37. The method according to claim 35, further comprising the step of:
changing sequence of burst length signals.

38. The method according to claim 37, wherein the step of changing the sequence of the burst length signals is implemented such that logic values of data transferred to adjacent input/output lines are opposite to each other.

39. The method according to claim 37,
wherein the step of changing the sequence of the burst length signals is implemented through a burst length exchanger; and
wherein the burst length exchanger is disposed between an input latch unit and a GIO input driver of the semiconductor memory apparatus and is activated by a write command.

40. The method according to claim 35, wherein the predetermined clock cycle is the same as a cycle of a clock signal which is received by the semiconductor memory apparatus from outside in a normal operation.

41. The method according to claim 40, wherein the cycle of the second clock corresponds to one half of the cycle of the first clock.

* * * * *